United States Patent [19]

Darwish

[11] Patent Number: 5,016,076
[45] Date of Patent: May 14, 1991

[54] LATERAL MOS CONTROLLED THYRISTOR

[75] Inventor: Mohamed N. Darwish, Glenmoore, Pa.

[73] Assignee: AT&T Bell Laboratories, Murray Hill, N.J.

[21] Appl. No.: 486,459

[22] Filed: Feb. 28, 1990

[51] Int. Cl.$^5$ ...................... H01L 29/74; H01L 29/78
[52] U.S. Cl. ............................................ 357/38; 357/39
[58] Field of Search ................................... 357/38, 39

[56] References Cited

U.S. PATENT DOCUMENTS

| 4,199,774 | 4/1980 | Plummer . | |
|---|---|---|---|
| 4,520,277 | 5/1985 | Hahn | 357/38 |
| 4,550,332 | 10/1985 | Wagner | 357/38 |
| 4,656,366 | 4/1987 | Davis et al. | 357/38 |
| 4,698,655 | 10/1987 | Schultz | 357/38 |
| 4,717,940 | 1/1988 | Shinohe et al. | 357/38 |
| 4,742,380 | 5/1988 | Chang et al. | 357/39 |
| 4,794,441 | 12/1988 | Sugawara et al. | 357/39 |
| 4,816,892 | 3/1989 | Temple | 357/39 |
| 4,861,731 | 8/1989 | Bhagat | 357/38 |
| 4,896,196 | 1/1990 | Blanchard et al. | 357/38 |
| 4,901,132 | 2/1990 | Kuwano | 357/35 |
| 4,942,440 | 7/1990 | Baliga et al. | 357/23.1 |

OTHER PUBLICATIONS

Darwish, "A New Lateral MOS-Controlled Thyristor", IEEE Electron Device Letters, vol. 11, No. 6, Jun. 1990, pp. 256-257.

"Insulated-Gate Planar Thyristors: I-Structure and Basic Operation," *IEEE Transactions on Electricon Devices*, vol. ED-27, No. 2 Feb. 1980, James D. Plummer, Brad W. Scharf pp. 380 through 394.

"MCTs-Thyristors for the Future," *Powertechnics Magazine*, Nov. 1989, Dr. V. A. K. Temple, pp. 21 through 24.

"MOS-Controlled Thyristors—A New Class of Power Devices", *IEEE Transactions on Electron Devices, Vol. ED-33, No. 10*, Oct. 1986, Victor A. K. Temple, pp. 1609 through 1618.

"MOS GTO—A Turn Off Thyristor with MOS-Controlled Emitter Shorts," IEDM 85, M. Stoisiek and H. Strack, Siemens AG, Munich FRG pp. 158 through 161.

*Primary Examiner*—Andrew J. James
*Assistant Examiner*—Viet Q. Nguyen
*Attorney, Agent, or Firm*—S. W. McLellan

[57] ABSTRACT

A lateral MOS-controlled thyristor (MCT) structure using a single MOS gate for both turn-on and turn off. By eliminating a parasitic lateral PNP transistor through the addition of a high resistivity region surrounding one output terminal, and adding a DMOS transistor to a conventional thyristor structure, the maximum turn-off current limit is increased with lower forward voltage drop than that available in prior art lateral MCTs.

8 Claims, 2 Drawing Sheets

LATERAL MOS CONTROLLED THYRISTOR

BACKGROUND OF THE INVENTION

1. Field of the Invention

This invention relates to thyristors in general and, more particularly, to lateral thyristors having MOS gates for use in integrated circuits or the like.

2. Description of the Prior Art

In the field of integrated power electronics, it is desirable to have on a single integrated circuit at least one power handling device and the necessary control circuitry to drive the device. In particular, it is especially desirable that the power handling device be controllable by a voltage instead of by a current. The advantage of voltage control circuitry is the increase in the power handling capacity thereof, compared to current control circuits. For example, an exemplary conventional power handling device, a thyristor, is usually a current controlled device. The current necessary to switch the thyristor on or off may well exceed the current driving capacity of complementary metal-oxide-semiconductor (CMOS) logic circuits. However, if the thyristor is designed to be switched with a voltage, conventional CMOS logic can directly drive even very high power thyristors. A voltage controlled thyristor is commonly known as a MOS controlled thyristor or MCT.

An exemplary MOS controlled thyristor, which is readily intergratable into an IC, is disclosed in "Insulated-Gate Planar Thyristors: I-Structure and Basic Operation," by J. D. Plummer and B. W. Scharf, *IEEE Transactions On Electron Devices*, Vol. ED-27, No. 2, Feb. 1980, pp 380–387. In FIG. 11 of Plummer's article, a lateral MOS controlled thyristor MCT is shown having separate gates for the turning "on" and turning "off" the thyristor. For clarity, Plummer's thyristor has been simplified and redrawn, as presented in FIG. 3. Thus, MCT 30 has an n-type epitaxial layer (40) with first and second p-type regions (31, 32) formed in the major surface of the epitaxial layer 40. A third n-type region 33 is formed within the first region 31 as the cathode of the thyristor. Similarly, another n-type region 35 is formed in the second region 32. Regions 32 and 35 are electrically connected together as the anode of the MCT 30. Another p-type region 36 is added and electrically connected to the third region 33 as part of the cathode. A first conductive layer 37 is disposed over, and is insulated from, portions of the regions 31, 33, and the epitaxial layer 40 to form an n-channel DMOS transistor for the "on" gate of the MCT 30. A second conductive layer 39 is disposed over, and is insulated from, the first region 31 and the epitaxial layer 40 between the regions 33 and 36 to form a PMOS transistor for the "off" gate of the MCT 30.

The Plummer MCT suffers from a parasitic PNP transistor formed by p-type region 36, n-type epitaxial layer 40, and p-type region 32. Since the on-gate (first conductive layer 37) cannot turn off the thyristor 30, the parasitic PNP is unavoidable with this structure since the region 36 and the off-gate (second conductive layer 39) must be provided.

The parasitic PNP gives rise to two dominant defects which limit the performance of the MCT 30: limited maximum current that the MCT can conduct while still allowing the off gate (39) to turn off the MCT (referred to as the maximum turn-off current), and increased forward voltage drop of the MCT 30.

The lowered maximum turn-off current defect results from a "sneak" path for current through the parasitic PNP transistor. The reduced maximum turn-off current is further decreased by the relatively high channel resistance of the PMOS transistor, limiting the amount of current that can be shunted to turn off the thyristor.

The increased forward voltage drop across the MCT results from the parasitic PNP transistor drawing off a large fraction of the injected anode hole current, reducing the gain of the thyristor. The reduced gain does not allow the thyristor to conduct as "hard" as would otherwise be possible. The reduced gain causes the forward voltage drop to be significantly greater than what could be obtained with a conventional thyristor.

An exemplary MOS controlled thyristor which does not suffer from the above defects as a result of a parasitic PNP transistor is disclosed in "MCTs- Thyristors For the Future," by Dr. V. A. K. Temple, *Powertechnics Magazine*, Nov. 1989, pp. 21–24. In particular, FIG. 4 of Temple's article shows the structure of this MCT. However, this structure is substantially vertically oriented, making it unsuitable for integration with other circuits into an integrated circuit (IC).

SUMMARY OF THE INVENTION

It is therefore one aspect of the invention to provide a lateral MOS controlled thyristor which does not have a parasitic transistor which significantly reduces the electrical performance thereof and may be formed in an integrated circuit.

It is another aspect of the invention to provide a lateral MOS controlled thyristor which allows for an increase in the maximum turn-off current compared to that of prior art lateral MOS controlled thyristors.

It is another aspect of the invention to provide a lateral MOS controlled thyristor which allows for a reduced forward voltage drop compared to prior art lateral MOS controlled thyristors.

The above aspects of the invention can be obtained by adapting a conventional lateral MOS controlled thyristor to have, in one embodiment, a first additional region, of conductivity type opposite that of the epitaxial layer, formed around a lower resistivity region of the same conductivity type; and a rectifying contact to the lower resistivity region, to form one output terminal of the thyristor.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
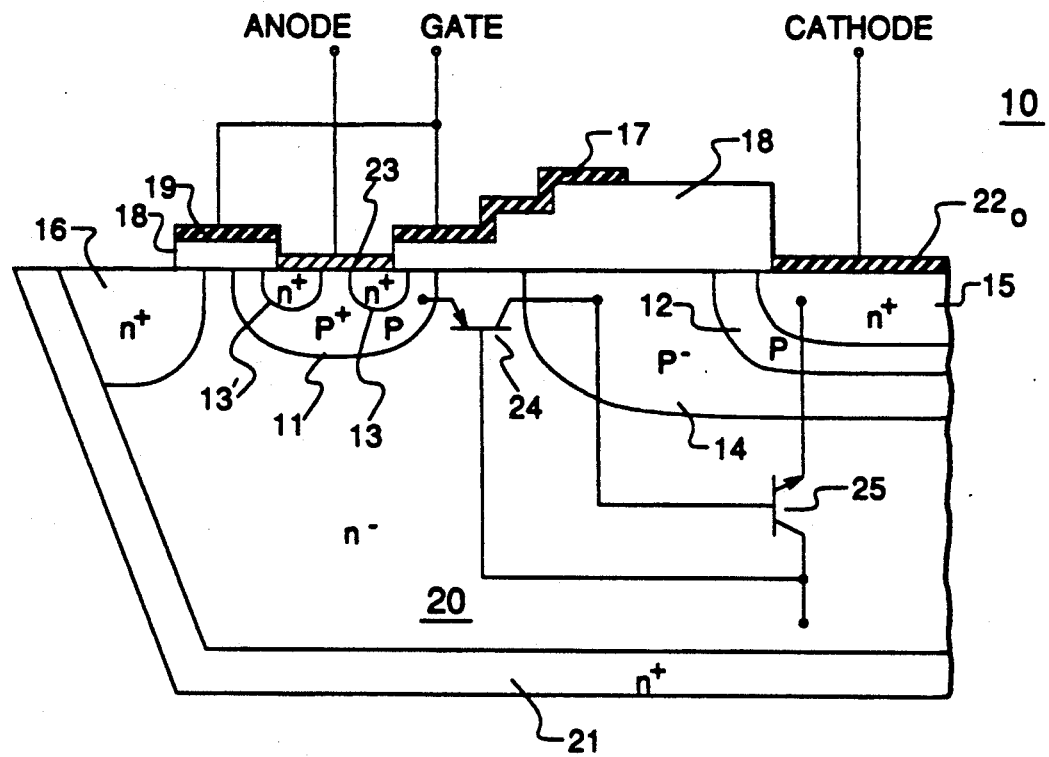
FIG. 1 is one-half a cross-sectional view of an exemplary embodiment of the invention (not to scale)

In FIG. 1 an exemplary embodiment of the invention is shown. The advantages of this embodiment result from the addition of region 14 to a conventional lateral MOS-controlled thyristor (MCT), reducing forward voltage drop and increasing the maximum turn-off current thereof. To further increase the maximum turn-off current of the MCT 10, in accordance with another embodiment of the invention, region 16 and second conductive layer 19, forming a DMOS transistor, and buried layer 21 are added to the exemplary MCT 10.

More particularly, and as a first exemplary embodiment, the cross-sectional diagram of the exemplary MCT 10 in FIG. 1 is shown for one-half of the MCT 10. It is understood that visible structure is mirror-imaged on the right of the diagram. For purposes here, the MCT 10 is formed in a substrate (not shown) and insulated therefrom by an insulating layer (not shown), such as silicon dioxide. This type of device formation is commonly referred to as dielectric isolation. However, it is understood that the method of isolating the MCT 10 from the substrate may be accomplished by more conventional methods, such as junction isolation.

The exemplary MCT 10 has an epitaxial layer 20, here n-type of relatively high resistivity, with a buried layer 21 substantially underlaying the MCT 10. The buried layer 21 has relatively low resistivity and enhances the current carrying capacity of the MCT 10, as will be explained in greater detail, below. A first region 11 and a spaced-apart second region 12 are formed into the major surface of the epitaxial layer 20. The conductivity type of the first and second regions 11, 12 are opposite that of the epitaxial layer 20 and have a lower resistivity than the layer 20. Into the first region 11 a third region 13 is formed, having a conductivity type the same as the epitaxial layer 20 and the same or lower resistivity than the first region 11. A fourth region 14, typically formed prior to the formation of the second region 12, surrounds, contacts, and has the same conductivity type as the second region 12. The resistivity of the fourth region 14 is typically high enough to assure that the region 14 is substantially depleted during normal operation when the MCT 10 is in the off-state. This level of resistivity is typically referred to as reduced surface field, or RESURF, raising the maximum voltage the MCT 10 can handle. Into second region 12, a fifth region 15 is added, having an opposite conductivity type from the second region 12. As will be explained below, region 15 is needed to form a rectifying contact to region 12 and the region 15 may be replaced with a Schottky rectifying contact instead. Because region 15 is the rectifying contact to region 12, metal contact $22_o$ is an ohmic contact to region 15, forming the cathode of the MCT 10. Similarly, metal layer 23, as the anode of the MCT 10, forms an ohmic contact to the first and third regions 11, 13. It is noted that the portion of the first region 11 has a lower resistivity near the ohmic contact of the layer 11 and metal layer 23.

A first conductive layer 17, typically doped polycrystalline silicon, forms the gate of the MCT 10. The layer 17 is disposed preferably over the portions of the first and third layer 11, 13 and the epitaxial layer 20 and is insulated therefrom by insulating layer 18, typically silicon dioxide. The extension of the layer 17 over the fourth region 14 serves as a field plate to further extend the maximum operating voltage of the MCT 10.

The layer 17 serves as the gate for both a conventional P-channel MOS transistor, commonly referred to as a PMOS transistor, to turn the MCT 10 "on" and an N-channel doubly-diffused MOS transistor, commonly referred to as a DMOS transistor, to turn the MCT 10 "off". The PMOS transistor (not numbered) is formed by the first region 11 and the fourth layer 14 as the drain and source thereof with the channel of the PMOS transistor forming along the major surface of the epitaxial layer 20 when the voltage on the layer 17 is negative.

The DMOS transistor (not numbered) is formed by the third region 13 and the epitaxial layer 20 as the source and drain regions thereof, with the channel forming along the major surface of the first layer 11 when the voltage on the layer 17 is positive.

A brief discussion of the operation of the MCT 10 is given herein. The thyristor portion of the MCT 10 is represented schematically by the presence of cross-coupled bipolar transistors 24 and 25 contacting the first, fourth, and fifth regions 11, 14, 15 and the epitaxial layer 20. Normally no substantial current flows from the anode to the cathode when the MCT is "off". When a sufficiently negative voltage is applied to the gate, the PMOS transistor is turned on, allowing current from the anode, through the first layer 11, to flow to the fourth layer 14. If the amount of current is sufficient, the thyristor portion of the MCT 10 latches up and is "on". When a sufficiently positive voltage is applied to the gate to turn the DMOS transistor on, current is "robbed" from the thyristor portion of the MCT 10 to reduce the gain thereof below unity, turning off the MCT 10. Hence, when a negative voltage is applied to the gate that is sufficient to turn on the P-channel transistor, the MCT 10 latches into its "on" state, conducting current from anode to cathode, or vice-versa, until either the current is interrupted or a voltage is applied to the gate which turns on the N-channel DMOS transistor sufficiently.

To enhance the maximum turn-off current that the MCT 10 can conduct and still have the gate turn off the MCT 10, another region 13', similar to third region 13, is added in the first region 11 and a sixth region 16 is added such that the first region is substantially located between the sixth region 16 and the fourth region 14. The conductivity type of the sixth region is the same as the epitaxial layer 20 but has a low resistivity. It is preferable that the sixth layer be in electrical contact with the buried layer 21 to further enhance the maximum turn-off current. A second layer 19 is added which overlays portions of the region 13', first region 11, epitaxial layer 20 and the sixth region 16. Thus, another N-channel DMOS transistor is formed by the sixth region 16/epitaxial layer 20 and the region 13' forming the drain and source thereof and the channel forming in the major surface of the first region 11 when the voltage on the layer 19 is sufficiently positive. Although the layer 19 is shown as electrically connected to the layer 17 as the gate of the MCT 10, it is understood that layers 17 and 19 may be one layer.

Figure 2:
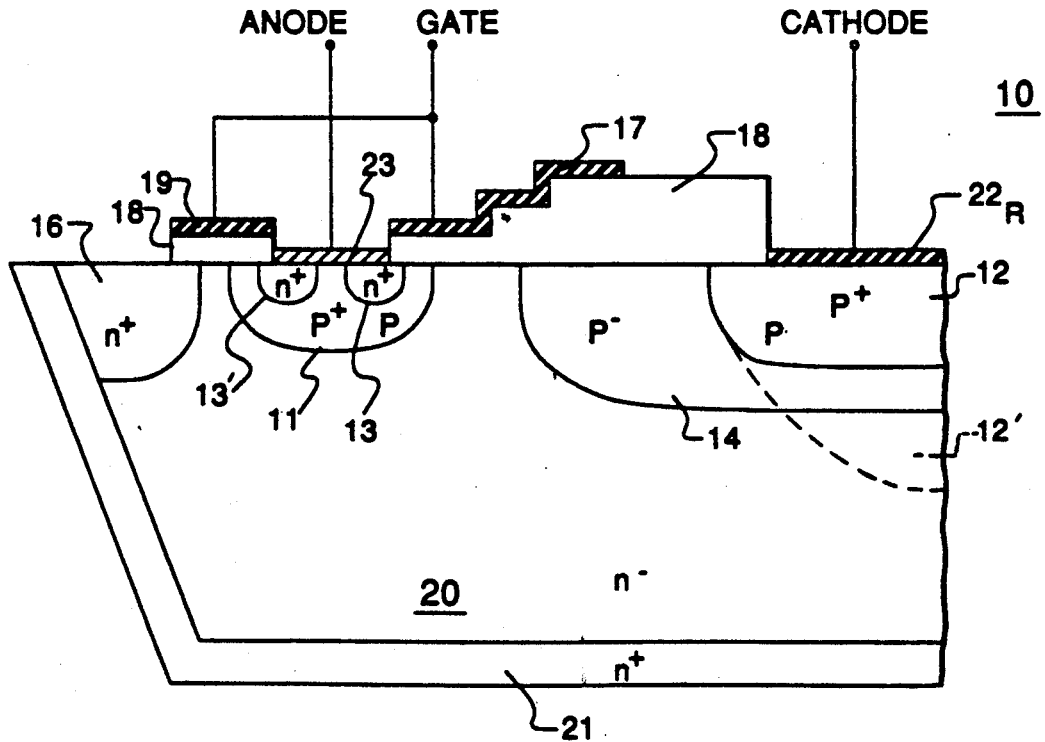
FIG. 2 is one-half a cross-sectional view of another exemplary embodiment of the invention (not to scale); and, FIG. 3 is a simplified one-half cross-sectional view of a prior-art MOS controlled thyristor (not to scale).
Figure 3:
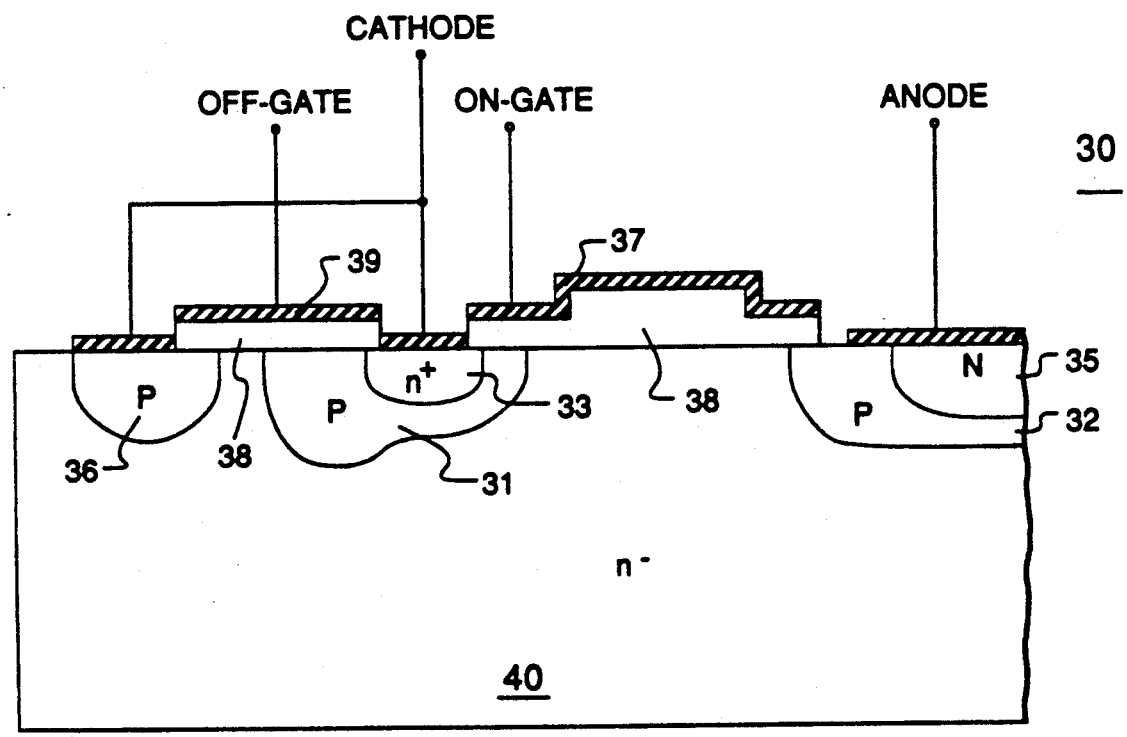

Modifications to the exemplary MCT 10 of FIG. 1 are shown in FIG. 2. One option is the substitution a Schottky rectifying contact by the metal layer $22_R$ for the region 15 (FIG. 1), as discussed above. Another option is the extending of the second region 12 to that represented by region 12', such that the second region 12, 12' is in contact with the epitaxial layer 20. It is noted that either option may be implemented together or separately.

Approximate exemplary resistivity ranges and preferred resistivities (in ohm-centimeters, $\Omega$-cm) for the epitaxial layer, the regions therein, and the buried layer for the MCT 10 of FIG. 1 are given below. The result is a 300 V, one ampere MCT.

| REGION OR LAYER | RESISTIVITY RANGE Ω-cm | PREFERRED RESISTIVITY Ω-cm |
| --- | --- | --- |
| first region 11 | $8 \times 10^{-3} - 10$ | $P^+:6 \times 10^{-2}, P:1$ |
| second region 12 | $0.2 - 10$ | 1 |
| third region 13 | $8 \times 10^{-4} - 2 \times 10^{-2}$ | $10^{-3}$ |
| fourth region 14 | $0.2 - 25$ | 6 |
| fifth region 15 | $8 \times 10^{-4} - 2 \times 10^{-2}$ | $10^{-3}$ |
| sixth region 16 | $8 \times 10^{-4} - 9 \times 10^{-2}$ | $8 \times 10^{-4}$ |
| epitaxial layer 20 | $2 - 30$ | 10 |
| buried layer 21 | $5 \times 10^{-3} - 9 \times 10^{-2}$ | $5 \times 10^{-3}$ |

The above exemplary embodiments of the invention are shown having certain conductivity type layers and regions. It is understood that the conductivity types may be interchanged with the resulting change in the turn-on and turn-off voltages for the MCT 10 (FIGS.1,2).

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

I claim:

1. A lateral MOS controlled thyristor, having first and second output terminals and a gate, disposed in the major surface of a high-resistivity semiconductor epitaxial layer (20) of a first conductivity type, is characterized by:

first (11) and second (12) spaced-apart regions of a second conductivity type in the epitaxial layer and adjacent to a major surface thereof;

a third region (13) of the first conductivity type within the first region and adjacent to the major surface;

a fourth region (14) of the second conductivity type in contact with the second region, disposed in the epitaxial layer and adjacent to the major surface;

a rectifying contact ($22_o$, 15 or $22_R$) with the second region; and, a conductive layer (17) overlaying and insulated from selected portions of the epitaxial layer and the first and fourth regions;

wherein the first and third regions are connected together to form the first output terminal, the rectifying contact forms the second output terminal, and the conductive layer forms the gate.

2. A lateral MOS controlled thyristor, having first and second output terminals and a gate, disposed in the major surface of a high-resistivity semiconductor epitaxial layer (20) of a first conductivity type, is characterized by:

first (11) and second (12) spaced-apart regions of a second conductivity type in the epitaxial layer and adjacent to a major surface thereof;

a third region (13) of the first conductivity within the first region and adjacent to the major surface;

a fourth region (14) of the second conductivity type in contact with the second region, disposed in the epitaxial layer and adjacent to the major surface;

a rectifying contact being a metal conductor ($22_R$) forming a Schottky barrier rectifying contact with the second region;

a conductive layer (17) overlaying and insulated from selected portions of the epitaxial layer and the first and fourth regions;

wherein the first and third regions are connected together to form the first output terminal, the rectifying contact forms the second output terminal, and the conductive layer forms the gate.

3. The thyristor as recited in claim 1, or 2 wherein the second region is completely within the fourth region.

4. The thyristor as recited in claim 1, or 2 wherein the second region (12) having an extended region (12') which contacts the epitaxial layer below the major surface.

5. The thyristor as recited in claim 1 or 2, further characterized by:

a sixth region (16) having a conductivity of the first type, disposed in the epitaxial layer adjacent to the major surface thereof, such that the first region (11) is between the sixth and fourth (14) regions; and an additional conductive layer (19), overlying and insulated from selected portions of the epitaxial layer and the first region (11), and between the third region (13) and the sixth region (16);

wherein the first region (11) is electrically connected to the third region (13) and the conductive layer (17) is electrically connected to the additional conductive layer (19).

6. The thyristor as recited in claim 5, further characterized by:

a buried layer (21) under the epitaxial layer (20), substantially underlaying the thyristor, extending and electrically connected to the sixth region (16).

7. The thyristor as recited in claim 6, wherein the buried layer (21) is a semiconductor material having a conductivity of the first type.

8. The thyristor as recited in claim 1, wherein the resistivity of the second region is lower than that of the fourth region and the resistivity of the epitaxial layer is greater than the resistivity of all the regions.

* * * * *